United States Patent
Ikhtiar et al.

(10) Patent No.: US 10,283,701 B1
(45) Date of Patent: May 7, 2019

(54) METHOD AND SYSTEM FOR PROVIDING A BORON-FREE MAGNETIC LAYER IN PERPENDICULAR MAGNETIC JUNCTIONS

(71) Applicant: Samsung Electronics Co., LTD., Gyeonggi-do (KR)

(72) Inventors: Ikhtiar, Milpitas, CA (US); Xueti Tang, Fremont, CA (US); Mohamad Towfik Krounbi, San Jose, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/890,101

(22) Filed: Feb. 6, 2018

Related U.S. Application Data

(60) Provisional application No. 62/588,579, filed on Nov. 20, 2017.

(51) Int. Cl.
| | |
|---|---|
| H01L 43/12 | (2006.01) |
| H01L 43/08 | (2006.01) |
| H01L 27/12 | (2006.01) |
| H01F 10/10 | (2006.01) |
| H01F 41/14 | (2006.01) |
| G11C 11/16 | (2006.01) |

(52) U.S. Cl.
CPC ............ *H01L 43/12* (2013.01); *G11C 11/161* (2013.01); *H01F 10/10* (2013.01); *H01F 41/14* (2013.01); *H01L 27/1222* (2013.01); *H01L 43/08* (2013.01)

(58) Field of Classification Search
None
See application file for complete search history.

(56) References Cited

U.S. PATENT DOCUMENTS

| | | | | |
|---|---|---|---|---|
| 8,582,253 | B1 * | 11/2013 | Zheng | G11B 5/1278 360/324.2 |
| 8,987,007 | B2 | 3/2015 | Tomioka | |
| 9,184,375 | B1 * | 11/2015 | Tang | H01L 27/222 |
| 9,218,826 | B1 * | 12/2015 | He | G11B 5/3906 |
| 9,660,184 | B2 | 5/2017 | Sikkik | |
| 9,666,640 | B2 | 5/2017 | Naik | |
| 2011/0303997 | A1 * | 12/2011 | Wang | B82Y 25/00 257/421 |

(Continued)

*Primary Examiner* — Lex H Malsawma
(74) *Attorney, Agent, or Firm* — Van Pelt, Yi & James LLP

(57) ABSTRACT

A magnetic junction and method for providing the magnetic junction are described. The method includes providing a pinned layer, a nonmagnetic spacer layer and a free layer switchable between stable magnetic states. The nonmagnetic spacer layer is between the pinned and free layers. Providing the pinned layer and/or providing the free layer includes cooling a portion of the magnetic junction, depositing a wetting layer while the portion of the magnetic junction is cooled, oxidizing/nitriding the wetting layer and depositing a boron-free magnetic layer on the oxide/nitride wetting layer. The portion of the magnetic junction is cooled to within a temperature range including temperature(s) not greater than 250 K. The wetting layer has a thickness of at least 0.25 and not more than three monolayers. The wetting layer includes at least one magnetic material. The boron-free magnetic layer has a perpendicular magnetic anisotropy energy greater than an out-of-plane demagnetization energy.

19 Claims, 7 Drawing Sheets

(56) References Cited

U.S. PATENT DOCUMENTS

| | | | |
|---|---|---|---|
| 2014/0001586 A1* | 1/2014 | Shen | H01L 43/10 |
| | | | 257/421 |
| 2016/0211440 A1 | 7/2016 | Siddik | |
| 2016/0211446 A1* | 7/2016 | Siddik | H01L 43/12 |
| 2016/0284763 A1 | 9/2016 | Tahmasebi | |
| 2017/0159172 A1 | 6/2017 | Hu | |
| 2017/0213957 A1 | 7/2017 | Hong | |

* cited by examiner

200

200

200

METHOD AND SYSTEM FOR PROVIDING A BORON-FREE MAGNETIC LAYER IN PERPENDICULAR MAGNETIC JUNCTIONS

CROSS-REFERENCE TO RELATED APPLICATIONS

This application claims the benefit of provisional Patent Application Ser. No. 62/588,579, filed Nov. 20, 2017, entitled BORON-FREE FREE LAYER FOR PERPENDICULAR MAGNETIC JUNCTIONS, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, a conventional magnetic tunneling junction (MTJ) may be used in a conventional STT-MRAM. The conventional MTJ typically resides on a substrate. The conventional MTJ, uses conventional seed layer(s), may include capping layers and may include a conventional antiferromagnetic (AFM) layer. The conventional MTJ includes a conventional pinned layer, a conventional free layer and a conventional tunneling barrier layer between the conventional pinned and free layers. A bottom contact below the conventional MTJ and a top contact on the conventional MTJ may be used to drive current through the conventional MTJ in a current-perpendicular-to-plane (CPP) direction. The reference layer and the free layer are magnetic. The magnetization of the reference layer is fixed, or pinned, in a particular direction. The free layer has a changeable magnetization. The free layer and reference layer may be a single layer or include multiple layers.

To switch the magnetization of the free layer, a current is driven in the CPP direction. When a sufficient current is driven from the top contact to the bottom contact, the magnetization of the free layer may switch to be parallel to the magnetization of a bottom reference layer. When a sufficient current is driven from the bottom contact to the top contact, the magnetization of the free layer may switch to be antiparallel to that of the bottom reference layer. The differences in magnetic configurations correspond to different magnetoresistances and thus different logical states (e.g. a logical "0" and a logical "1") of the conventional MTJ.

Because of their potential for use in a variety of applications, research in magnetic memories is ongoing. For example, a low switching current, sufficient thermal stability and high perpendicular magnetic anisotropy may be desired for improved write efficiency and data retention. These properties are desired to be present in the magnetic junctions in the final device. Accordingly, what is needed is a method and system that may improve the performance of spin transfer torque based memories and the electronic devices in which such memories are used. The method and system described herein address such a need.

BRIEF SUMMARY OF THE INVENTION

A magnetic junction and method for providing the magnetic junction are described. The method includes providing a pinned layer, providing a nonmagnetic spacer layer and providing a free layer switchable between stable magnetic states. The nonmagnetic spacer layer is between the pinned and free layers. Providing the pinned layer and/or providing the free layer includes cooling a portion of the magnetic junction, depositing a wetting layer while the portion of the magnetic junction is cooled, oxidizing or nitriding the wetting layer to provide an oxide or nitride wetting layer and depositing a boron-free magnetic layer on the oxide/nitride wetting layer. The portion of the magnetic junction is cooled to within a temperature range including temperature(s) not greater than 250 K. The wetting layer has a thickness of at least 0.25 monolayer and not more than three monolayers. The wetting layer includes at least one magnetic material. The boron-free magnetic layer has a perpendicular magnetic anisotropy energy greater than an out-of-plane demagnetization energy.

Using the method and system, the free layer and/or pinned layer may include or consist of a boron-free layer. Thus, the perpendicular magnetic anisotropy, stability and switching performance of the magnetic junction may be improved.

DETAILED DESCRIPTION OF THE INVENTION

Figure 1:
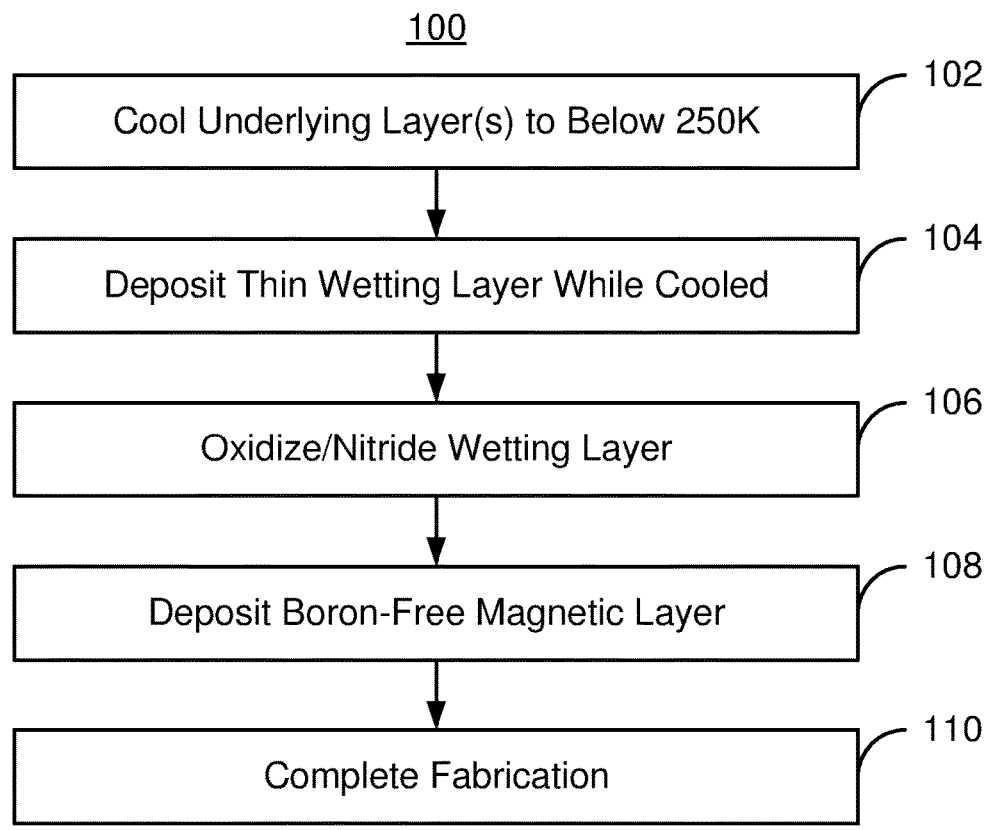
FIG. 1 is a flow chart depicting an exemplary embodiment of a method for providing a boron-free magnetic layer for a magnetic junction usable in magnetic devices such as a magnetic memory programmable using spin transfer torque.

The exemplary embodiments relate to magnetic junctions usable in magnetic devices, such as magnetic memories, and the devices using such magnetic junctions. The magnetic memories may include spin transfer torque magnetic random access memories (STT-MRAMs), spin-orbit coupling torque (SOT) memories, and may be used in electronic devices employing nonvolatile memory. Other devices including magnetic junctions, particularly STT or SOT programmable magnetic junctions include but are not limited to logic, neuromorphic computing cells and other devices. Electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or fewer components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

A magnetic junction and method for providing the magnetic junction are described. The method includes providing a pinned layer, providing a nonmagnetic spacer layer and providing a free layer switchable between stable magnetic states. The nonmagnetic spacer layer is between the pinned and free layers. Providing the pinned layer and/or providing the free layer includes cooling a portion of the magnetic junction, depositing a wetting layer while the portion of the magnetic junction is cooled, oxidizing and/or nitriding the wetting layer to provide an oxide/nitride wetting layer and depositing a boron-free magnetic layer on the oxide/nitride wetting layer. The portion of the magnetic junction is cooled to within a temperature range including temperature(s) not greater than 250 K. The wetting layer has a thickness of at least 0.25 monolayer and not more than three monolayers. The wetting layer includes at least one magnetic material. The boron-free magnetic layer has a perpendicular magnetic anisotropy energy greater than an out-of-plane demagnetization energy.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. One of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. One of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction. The method and system are also described in the context of certain alloys. Unless otherwise specified, if specific concentrations of the alloy are not mentioned, any stoichiometry not inconsistent with the method and system may be used.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Although described in the context of a boron-free free magnetic layer, in alternate embodiment, the method and system may be used to fabricate magnetic junctions that are free of other and/or all glass-forming components. For example, the layer may not include B, C and other glass-forming material(s) used in providing a layer that is amorphous-as deposited.

FIG. 1 is a flow chart depicting an exemplary embodiment of a method for providing a boron-free magnetic layer for a magnetic junction usable in magnetic devices such as a magnetic memory programmable using spin transfer torque (STT) and/or spin-orbit coupling torque (SOT). The magnetic layers of the magnetic junction may have a high perpendicular magnetic anisotropy (PMA). Stated differently, the perpendicular magnetic anisotropy energy may exceed the out-of-plane demagnetization energy. Such a configuration allows for the magnetic moment of a high PMA layer to be stable perpendicular to plane. For simplicity, some steps may be omitted, performed in another order, include substeps and/or combined. Further, the method 100 may start after other steps in forming a magnetic junction have been performed. FIGS. 2-5 depict an exemplary embodiment of a portion 200 for a magnetic junction that may be fabricated using the method 100. FIGS. 2-5 are not to scale. Referring to FIGS. 1-5, the method 100 is described in the context of the layers 200 for the magnetic junction. However, analogous layer for other magnetic junctions may be formed. Further, multiple layers for multiple magnetic junctions may be simultaneously fabricated. The layer(s) described herein may be used in forming all or part of a free layer, a pinned layer, or other magnetic layer in a magnetic junction.

Figure 2:
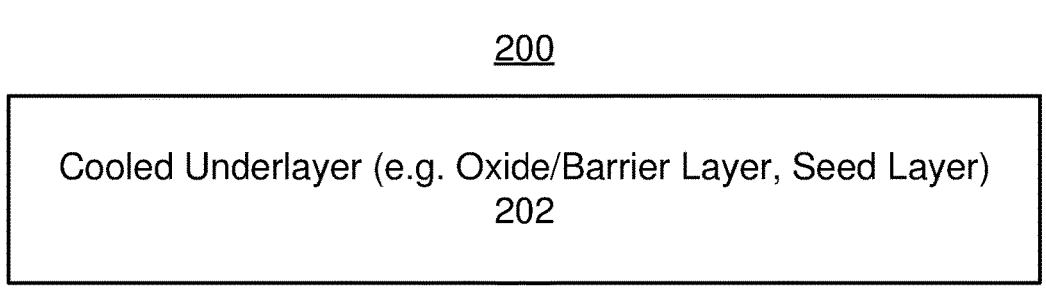
FIGS. 2-5 depict an exemplary embodiment of a layer for a magnetic junction usable in magnetic devices such as a magnetic memory programmable using spin transfer torque during fabrication.

A portion of the magnetic junction that has already been fabricated is cryo-cooled to within a temperature range including temperatures not greater than 250 K, via step 102. In some embodiments, the temperature range includes temperature(s) of at least 50K and not greater than 150K. In some such embodiments, the temperature range is from at least 70K through not greater than 100K. FIG. 2 depicts a portion of the magnetic layers 200 being formed. Thus, the underlayer 202 is cooled to a wafer temperature described above. The underlayer 202 may be an oxide layer and may function as a seed layer for subsequent layers. In some embodiments, the underlayer 202 may be a tunneling barrier layer that is part of a single/bottom pinned or dual magnetic junction. Thus, the underlayer 202 may be a crystalline MgO layer, an $MgAl_2O_4$ layer, an MgTiOx (where Ox denotes an oxide of varying stoichiometry), or other insulating layer that may serve in whole or in part as the tunneling barrier layer for a magnetic tunneling junction. Alternatively, the underlayer 202 may be an oxide seed layer. For example, if a single top-pinned magnetic junction is formed, then the underlayer 202 may be a seed layer that can also be used to enhance the PMA of the free layer. If a single bottom-pinned magnetic junction or a dual magnetic junction is formed, then the underlayer 202 may be a seed layer that may increase the PMA of the pinned layer.

While the underlayer 202 is cooled, a thin wetting layer is deposited, via step 104. Step 104 may be carried out via sputtering, physical vapor deposition (PVD) or other appropriate process. The underlayer 202 is cooled for step 104 to encourage atoms of the wetting layer provided in step 104 to spread uniformly across the underlayer 202. Consequently, the formation of islands is discouraged. However, as discussed below, less than a monolayer may be deposited in step 104. Thus, the wetting layer provided in step 104 may not be continuous and/or may have voids therein. However, the wetting layer provided in step 104 is smoother/has a lower surface roughness than if deposited at higher temperatures.

Figure 3:
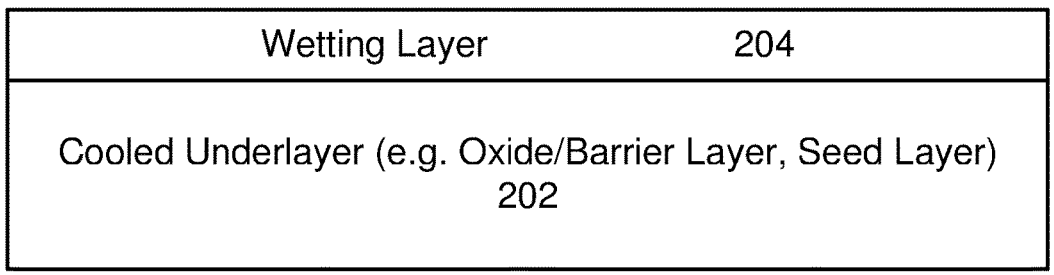

FIG. 3 depicts the layers 200 after step 104. Thus, a wetting layer 204 has been deposited. Although depicted as a continuous layer, as discussed above, the wetting layer 204 need not be. The wetting layer 204 includes material(s) that may be used as a precursor to a subsequent magnetic layer. The wetting layer 204 may include or consist of 3d transition metal(s) and/or their alloys. For example, might consist at least one of elemental Fe, elemental Co, elemental Ni, elemental Mn, an Fe-containing alloy such as CoFe, a Co-containing alloy such as CoFe, a Ni-containing alloy and a Mn containing alloy. With the exception of B and optionally other materials, such as nontransition metals, might be included as part of the alloy used in the wetting layer. However, step 104 may omit the deposition of any foreign atoms in the wetting layer 204. Foreign atoms are any atoms not included in the subsequent boron-free layer, described below. In addition, in some embodiments, the material(s) used for the wetting layer 204 are also desired to be magnetic. The wetting layer 204 is also thin. In some embodiments, the wetting layer thickness is at least 0.25 monolayer and not more than three monolayers. In some cases, the thickness may be at least 0.5 monolayers and not more than two monolayers. In some such embodiments the wetting layer 204 has a thickness of at least 0.75 monolayer and not more than 1.25 monolayers.

The wetting layer 204 is treated, via step 106. The wetting layer is oxidized or nitrided in this step. Step 106 may include naturally oxidizing the wetting layer 204. In other embodiments, other oxidation methods such as reactive oxidation may be employed. Similarly, step 106 may include naturally or reactively nitriding the wetting layer. The oxidation/nitridation step is desired to continue until a target RA (resistance area product) is achieved. In some embodiments, the RA target is nominally ten. However, other Ras or other measures of the oxidation may be used to determine when to terminate oxidation. In some embodiments, step 106 may be continued until the wetting layer 204 is completely oxidized/nitrided. In addition, because step 106 is performed shortly after step 104, the wafer/portion of the magnetic junction already provided may still be cooled. For example, the portion of the magnetic junction already formed may be in the temperature range described above for steps 102 and 104. Thus, a treated wetting layer is provided. The treated wetting layer may be an oxide wetting layer or a nitride wetting layer.

Figure 4:
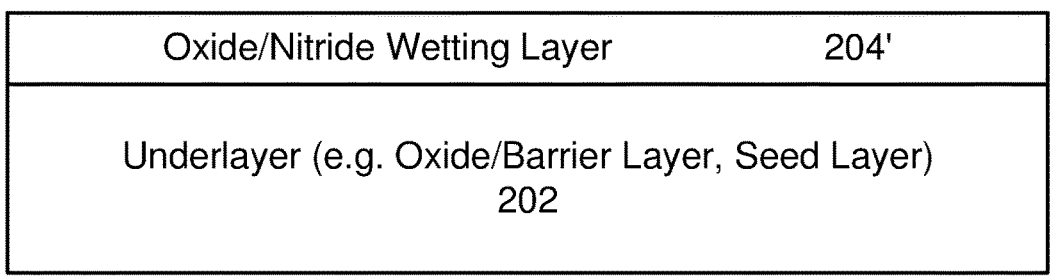

FIG. 4 depicts the layers 200 after step 106 is performed. Thus, the oxide/nitride wetting layer 204' has been formed. Although all of the wetting layer 204 appears to have been converted to an oxide/nitride in FIG. 4, in other embodiments the oxidation/nitridation may not be complete. For example, the oxide/nitride wetting layer 204' may include or consist of Fe-Ox and/or CoFe-Ox where Ox denotes an oxide.

A boron-free magnetic layer is deposited on the oxide/nitride wetting layer 204', via step 108. The material(s) deposited for the boron-free magnetic layer may include the material(s) deposited for the oxide/nitride wetting layer 204' in step 104. Step 108 may include depositing 3d transition metals, their alloys and/or Heusler alloys such as $Co_2Fe$, $Co_2MnSi$, $Co_2FeMnSi$, $Co_2FeSi$, MnGa, and MnGe. Thus, binary, ternary and other alloys not including boron may be deposited in step 108. Stated differently, other and/or additional nonmagnetic and/or magnetic materials excluding boron may be provided in step 108 for the boron-free magnetic layer. For example, CoX, FeX, NiX, CoFeX and/or CoFeNiX, where X is not B, may be used. Similarly, elements such as Fe, Co, Ni and Mn might be deposited.

Thus, step 108 may include depositing at least one of elemental Fe, elemental Co, elemental Ni, elemental Mn, an Fe-containing alloy such as CoFe, a Co-containing alloy such as CoFe, a Ni-containing alloy, a Mn containing alloy and a Heusler alloy.

In at least some embodiments, the underlying layers, which were cryo-cooled in step 102, may still be cool during step 108. This is because the time between the cooling step 102 and the boron-free magnetic layer deposition step 108 may be quite short in comparison to the time taken for the wafer's temperature to increase to room temperature naturally. Thus, the temperature of the underlying layers may be well under three hundred Kelvin in step 108, for example not more than two hundred fifty Kelvin. For example, in some embodiments, the temperature of the wafer may be not more than two hundred Kelvin at the start of the deposition of the boron-free magnetic layer. In some such embodiments, the temperature of the wafer may not exceed one hundred Kelvin at the start of the deposition. In an alternate embodiment, the deposition in step 108 may include a second cooling step. In such embodiments, the underlayer(s)/wafer are cooled prior to the deposition of the wetting layer in step 102 and again as part of/before deposition of the boron-free magnetic layer in step 108. The cooling as part of step 108 may be to the same temperature ranges as in step 102. Alternatively, the device may be cooled to temperatures that are higher but still less than three hundred Kelvin. For example, a cryo-cooling performed in step 108 may be to temperatures not exceeding two hundred fifty Kelvin. However, such a second cooling step may be unnecessary as long as the wafer remains cool in step 108 due to the cooling in step 102.

Figure 5:
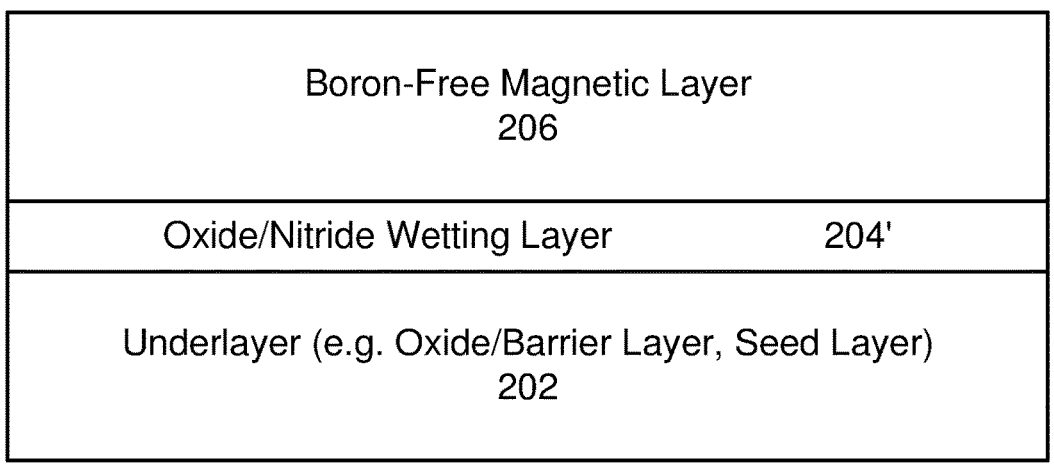

FIG. 5 depicts the layer 200 after step 108 has been completed. Thus, the boron-free magnetic layer 206 has been formed. The boron-free magnetic layer 206 may include the materials described above and may be polycrystalline as deposited. In addition, the boron-free magnetic layer 206 may have a high PMA. The perpendicular magnetic anisotropy energy of the layer 206 may exceed the out-of-plane demagnetization energy. Thus, the magnetic moment (not shown) of the boron-free magnetic layer 206 may be stable perpendicular-to-plane.

Fabrication of the magnetic junction may then be completed, via step 110. Step 110 may include annealing the layers 200 at temperature(s) above room temperature (300K) to complete crystallization of the boron-free magnetic layer 206. For example, a rapid thermal anneal may be employed. A plasma etch may be used in addition to or in lieu of the anneal to improve crystallinity. An oxide layer may also be deposited on the boron-free magnetic layer 206. The oxide layer may be a tunneling barrier layer or a capping layer. Alternatively, other layers might be provided on the boron-free magnetic layer 206. Further, as the boron-free magnetic layer 206 is part of the magnetic junction stack, the boron-free magnetic layer 206 as well as other layers in the device may be masked, etched to define the magnetic junction and/or undergo other processing.

Using the method 100, a boron-free magnetic layer 206 having a high PMA may be fabricated. When used in the free layer, the boron-free magnetic layer 206 may have improved stability. The magnetoresistance of such a magnetic junction may also be improved. Further, if the free layer consists of the boron-free magnetic layer 206, the free layer is compositionally uniform. As such, switching performance of the magnetic junction may be improved. If used in the pinned layer, the boron-free magnetic layer 206 may also improve the PMA of such a layer. Thus, performance a magnetic junction formed with the layer 206 fabricated using the method 100 may be improved.

Figure 6:
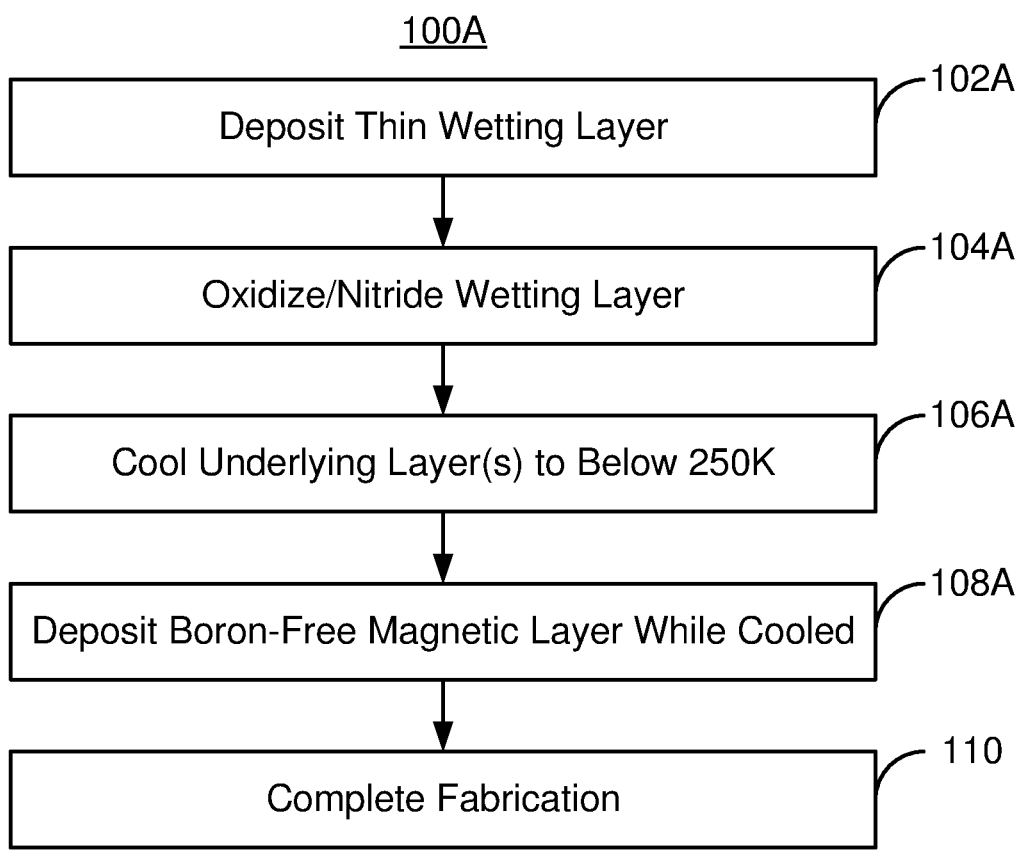
FIG. 6 is a flow chart depicting another exemplary embodiment of a method for providing a boron-free magnetic layer for a magnetic junction usable in magnetic devices such as a magnetic memory programmable using spin transfer torque.

FIG. 6 is a flow chart depicting an exemplary embodiment of a method 100A for providing a boron-free magnetic layer for a magnetic junction usable in magnetic devices such as a magnetic memory programmable using STT and/or SOT. The magnetic layers of the magnetic junction may have a high PMA. Stated differently, the perpendicular magnetic anisotropy energy may exceed the out-of-plane demagnetization energy. Such a configuration allows for the magnetic moment of a high PMA layer to be stable perpendicular to plane. For simplicity, some steps may be omitted, performed in another order, include substeps and/or combined. Further, the method 100A may start after other steps in forming a magnetic junction have been performed. The method 100A is analogous to the method 100. Consequently, similar steps have analogous labels. The layer(s) described herein may be used in forming all or part of a free layer, a pinned layer, or other magnetic layer in a magnetic junction.

A thin wetting layer is deposited, via step 102A. Step 102A may be carried out via sputtering, PVD or other appropriate process. Step 102A is analogous to step 104 of the method 100. However, the device is not cryo-cooled prior to step 102A. The wetting layer is deposited on an underlayer that may be an oxide layer and may function as a seed layer for subsequent layers. In some embodiments, the underlayer may be a tunneling barrier layer that is part of a single/bottom pinned or dual magnetic junction. Thus, the underlayer may be a crystalline MgO layer, an $MgAl_2O_4$ layer, an MgTiOx, or other insulating layer that may serve in whole or in part as the tunneling barrier layer for a magnetic tunneling junction. Alternatively, the underlayer may be an oxide seed layer. For example, if a single top-pinned magnetic junction is formed, then the underlayer may be a seed layer that can also be used to enhance the PMA of the free layer. If a single bottom-pinned magnetic junction or a dual magnetic junction is formed, then the underlayer may be a seed layer that may increase the PMA of the pinned layer.

The wetting layer that is deposited in step 102A may be a continuous layer or may have pinholes/apertures therein. The wetting layer deposited is analogous to the wetting layer 204 described above and may include analogous materials. The wetting layer includes material(s) that may be used as a precursor to a subsequent magnetic layer. The wetting layer may include or consist of 3d transition metal(s) and/or their alloys. For example, might consist at least one of elemental Fe, elemental Co, elemental Ni, elemental Mn, an Fe-containing alloy such as CoFe, a Co-containing alloy such as CoFe, a Ni-containing alloy and a Mn containing alloy. With the exception of B and optionally other materials, such as nontransition metals, might be included as part of the alloy used in the wetting layer. However, step 102A may omit the deposition of any foreign atoms in the wetting layer. Foreign atoms are any atoms not included in the subsequent boron-free layer, described below. In addition, in some embodiments, the material(s) used for the wetting layer are also desired to be magnetic. The wetting layer is also thin. In some embodiments, the wetting layer thickness is at least 0.25 monolayer and not more than three monolayers. In some cases, the thickness may be at least 0.5 monolayers and not more than two monolayers. In some such embodiments the wetting layer 204 has a thickness of at least 0.75 monolayer and not more than 1.25 monolayers.

The wetting layer is oxidized and/or nitrided, via step 104A. Step 104A is analogous to step 106 of the method 100. Step 104A may include naturally oxidizing the wetting layer. In other embodiments, other oxidation methods such as reactive oxidation may be employed. Similarly, the wetting layer may be exposed to a nitriding ambient and may be heated to form a nitride. Thus, a nitride wetting layer may be formed by natural nitriding or reactive nitridization. The oxidation/nitridation step is desired to continue until a target RA is achieved. In some embodiments, the RA target is nominally ten. However, other RAs or other measures of the oxidation/nitridation may be used to determine when to terminate the process. In some embodiments, step 104A may be continued until the wetting layer is completely oxidized or nitrided. For example, an oxide wetting layer may include or consist of Fe-Ox and/or CoFe-Ox where Ox denotes an oxide. Thus, a treated wetting layer that may be an oxide wetting layer or a nitride wetting layer is provided.

A portion of the magnetic junction that has already been fabricated is cryo-cooled to within a temperature range including temperatures not greater than 250 K, via step 106A. Step 106A is analogous to step 102 of the method 100. However, more of the magnetic junction has been fabricated so more of the magnetic junction is cooled. More specifically, the oxide/nitride wetting layer is also cooled in step 106A. In some embodiments, the temperature range includes temperature(s) of at least 50K and not greater than 150K. In some such embodiments, the temperature range is from at least 70K through not greater than 100K.

While the substrate for the magnetic junction is cooled using step 106A, a boron-free magnetic layer is deposited on the oxide/nitride wetting layer, via step 108A. Step 108A is analogous to step 108. However, in step 108A the device is cryo-cooled. The material(s) deposited for the boron-free magnetic layer may include the material(s) deposited for the oxide/nitride wetting layer deposited in step 102A. Step 108A may include depositing 3d transition metals, their alloys and/or Heusler alloys such as $Co_2Fe$, $Co_2MnSi$, $Co_2FeMnSi$, $Co_2FeSi$, MnGa, and MnGe. Thus, binary, ternary and other alloys not including boron may be deposited in step 108A. Stated differently, other and/or additional nonmagnetic and/or magnetic materials excluding boron may be provided in step 108A for the boron-free magnetic layer. For example, CoX, FeX, NiX, CoFeX and/or CoFeNiX, where X is not B, may be used. Similarly, elements such as Fe, Co, Ni and Mn might be deposited. Thus, step 108A may include depositing at least one of elemental Fe, elemental Co, elemental Ni, elemental Mn, an Fe-containing alloy such as CoFe, a Co-containing alloy such as CoFe, a Ni-containing alloy, a Mn containing alloy and a Heusler alloy.

Thus, step 108A provides a boron-free magnetic layer including the materials described above and that be polycrystalline as-deposited. In addition, the boron-free magnetic layer may have a high PMA. The perpendicular magnetic anisotropy energy of the layer may exceed the out-of-plane demagnetization energy. Thus, the magnetic moment (not shown) of the boron-free magnetic layer 206 may be stable perpendicular-to-plane.

Fabrication of the magnetic junction may then be completed, via step 110. Step 110 may include annealing the layers 200 at temperature(s) above room temperature (300K) to complete crystallization of the boron-free magnetic layer. For example, a rapid thermal anneal may be employed. A plasma etch may be used in addition to or in lieu of the anneal to improve crystallinity. An oxide layer may also be deposited on the boron-free magnetic layer. The oxide layer may be a tunneling barrier layer or a capping layer. Alternatively, other layers might be provided on the boron-free magnetic layer. Further, as the boron-free magnetic layer is part of the magnetic junction stack, the boron-free magnetic layer as well as other layers in the device may be masked, etched to define the magnetic junction and/or undergo other processing.

Using the method 100A, the layers shown in FIG. 5 may be manufactured. Thus, the method 100A may share the benefits of the method 100. A boron-free magnetic layer 206 having a high PMA may be fabricated. It is believed that the quality of the boron-free magnetic layer 206 provided using the method 100 may be superior to that provided using the method 100A. For example, the roughness of the wetting layer 204' may be reduced for the method 100. The wetting layer 204' may also have fewer voids for the method 100 over the method 100A. This may result in a better boron-free magnetic layer 206 for the method 100. However, the boron-free magnetic layer provided in step 108/108A may still exhibit improved quality and the desired characteristics described herein. When used in the free layer, therefore, the boron-free magnetic layer 206 formed using the method 100A may have improved stability. The magnetoresistance of such a magnetic junction may also be improved. Further, if the free layer consists of the boron-free magnetic layer 206 formed in the method 100A, the free layer is compositionally uniform. As such, switching performance of the magnetic junction may be improved. If used in the pinned layer, the boron-free magnetic layer 206 may also improve the PMA of such a layer. Thus, performance a magnetic junction formed with the layer 206 fabricated using the method 100 may be improved.

Figure 7:
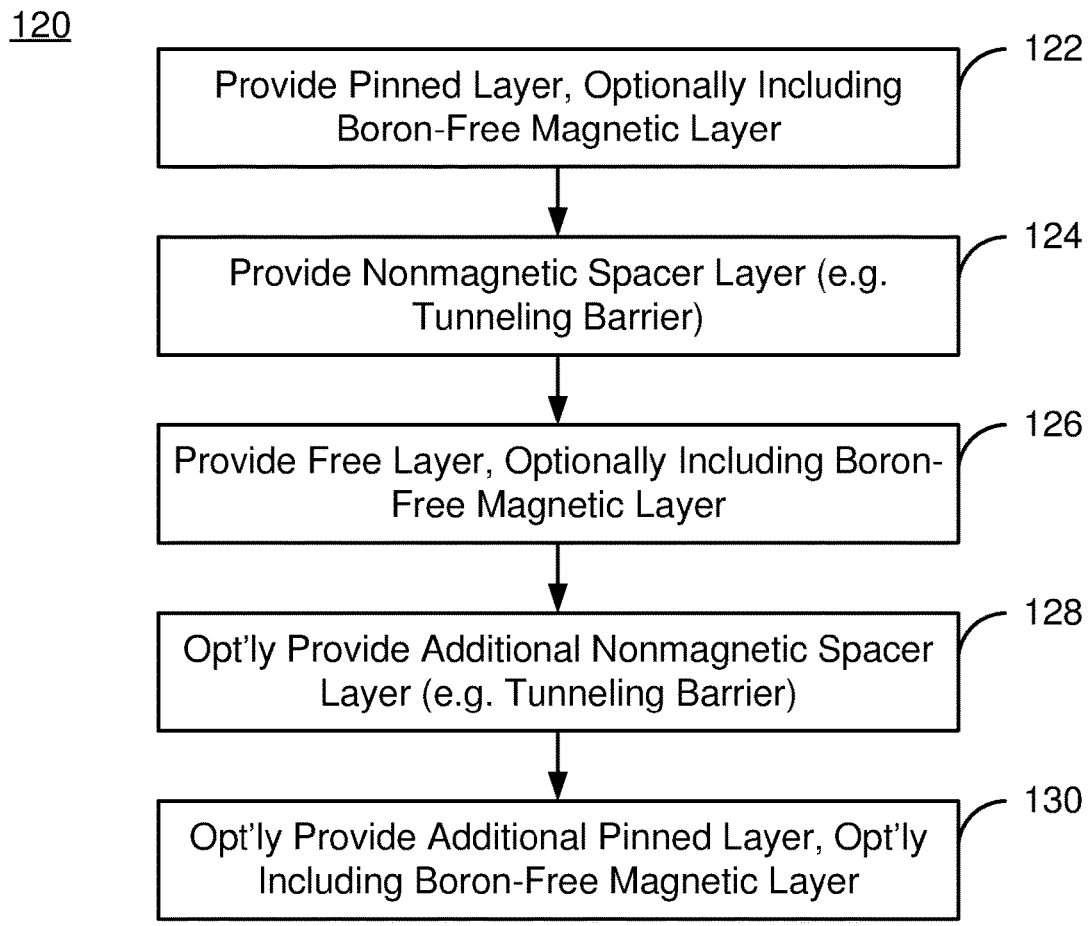
FIG. 7 is a flow chart depicting an exemplary embodiment of a method for providing a magnetic junction that includes boron-free magnetic layer(s) and that is usable in magnetic devices such as a magnetic memory programmable using spin transfer torque.

FIG. 7 is a flow chart depicting an exemplary embodiment of a method 120 for providing a magnetic junction that includes boron-free magnetic layer(s) and that is usable in magnetic devices such as a magnetic memory programmable using STT and/or SOT. The magnetic junction formed is usable in a magnetic device such as a STT-MRAM, SOT-MRAM and in a variety of electronic devices. For simplicity, some steps may be omitted, performed in another order, include substeps and/or combined. Further, the method 120 may start after other steps in forming a magnetic memory have been performed. Further, multiple magnetic junctions may be simultaneously fabricated.

A pinned layer may be provided, via step 122. Step 122 is performed for a bottom pinned magnetic junction (pinned layer formed before the free layer) and for a dual magnetic junction. The pinned layer is magnetic and may have its magnetization pinned, or fixed, in a particular direction during at least a portion of the operation of the magnetic junction. The pinned layer may thus be thermally stable at operating temperatures. The pinned layer formed in step 122 may be a simple (single) layer or may include multiple layers. For example, the pinned layer formed in step 122 may be a synthetic antiferromagnet (SAF) including magnetic layers antiferromagnetically or ferromagnetically coupled through thin nonmagnetic layer(s), such as Ru. In such a SAF, each magnetic layer may also include multiple layers. The pinned layer may also be another multilayer. The pinned layer formed in step 122 may have a perpendicular anisotropy energy that exceeds the out-of-plane demagnetization energy. Thus, the pinned layer may have its magnetic moment oriented perpendicular to plane. Other orientations of the magnetization of the pinned layer are possible. The pinned layer may also include a polarization enhancement layer (PEL) at the interface with the nonmagnetic spacer layer discussed below. In some embodiments, step 122 is performed using the method 100. Thus, formation of the pinned layer may include cryo-cooling the substrate, depositing the wetting layer, oxidizing the wetting layer and depositing a boron-free magnetic layer. Additional steps and/or additional layers may also be provided for the pinned layer in some embodiments. Further, the pinned layer may be deposited on an oxide seed layer such as the layer 202.

A nonmagnetic spacer layer may be provided, via step 124. Step 124 is performed for a bottom pinned magnetic junction and a dual magnetic junction. In some embodiments, a crystalline MgO tunneling barrier layer may be desired for the magnetic junction being formed. In some embodiments, step 124 may include depositing MgO using, for example, radio frequency (RF) sputtering. In other embodiments, metallic Mg may be deposited and then oxidized in step 124 to provide a natural oxide of Mg. The MgO barrier layer/nonmagnetic spacer layer may also be formed in another manner. Other materials including but not limited to MgAlOx and MgTiOx may be used in addition to or in lieu of MgO. Step 124 may include annealing the portion of the magnetic junction already formed to provide crystalline MgO tunneling barrier with a (100) orientation for enhanced TMR of the magnetic junction.

A free layer is provided, via step 126. Step 126 includes depositing the material(s) for the free layer. In some embodiments, step 126 is performed using the method 100. Thus, formation of the free layer may include or consist of cryo-cooling the substrate, depositing the wetting layer, oxidizing the wetting layer and depositing a boron-free magnetic layer. If steps 122 and 124 are omitted, then the free layer may be deposited on seed layer(s). In such embodiments, a top pinned magnetic junction is fabricated. The seed layer(s) may be selected for various purposes including but not limited to the desired crystal structure of the free layer, magnetic anisotropy and/or magnetic damping of the free layer. For example, the free layer may be provided on a seed layer such as a crystalline MgO layer that promotes a perpendicular magnetic anisotropy in the free layer. If a dual magnetic junction or bottom pinned magnetic junction is fabricated, the free layer may be formed on a nonmagnetic spacer layer provided in step 124. Thus, the oxide layer 202 of FIGS. 2-5 may be a seed layer or a nonmagnetic spacer/tunneling barrier layer.

A nonmagnetic spacer layer may be provided, via step 128. Step 128 is performed if a dual magnetic junction or top pinned magnetic junction is desired to be fabricated. If a single, bottom pinned magnetic junction is desired, then step 128 is omitted. In some embodiments, an additional crystalline MgO tunneling barrier layer may be desired for the magnetic junction being formed. Step 128 may thus be performed as described above with respect to step 124.

An additional pinned layer may optionally be provided, via step 130. Step 130 may be performed if a dual magnetic junction or top pinned magnetic junction is desired to be fabricated. If a single, bottom pinned magnetic junction is desired, then step 130 is omitted. In some embodiments, step 130 is performed using the method 100. Thus, formation of the pinned layer may include cryo-cooling the substrate, depositing the wetting layer, oxidizing the wetting layer and depositing a boron-free magnetic layer.

Fabrication of the magnetic junction may then be completed. For example, the capping layer(s) may be deposited and the edges of the magnetic junction defined, for example by providing a mask on the layers that have been deposited and ion milling the exposed portions of the layers. In some embodiments, an ion mill may be performed. Thus, the edges of the magnetic junction may be defined after steps 122 through 130 are performed. Stated differently, steps 122 through 130 may deposit the layers in the magnetic junction stack, and the edges of the each of the junctions on the wafer defined only after all of the layers have been provided. Alternatively, the edges of various layers may be formed at other times. Additional structures, such as contacts and conductive lines may also be formed for the device in which the magnetic junction is used.

Figure 8:
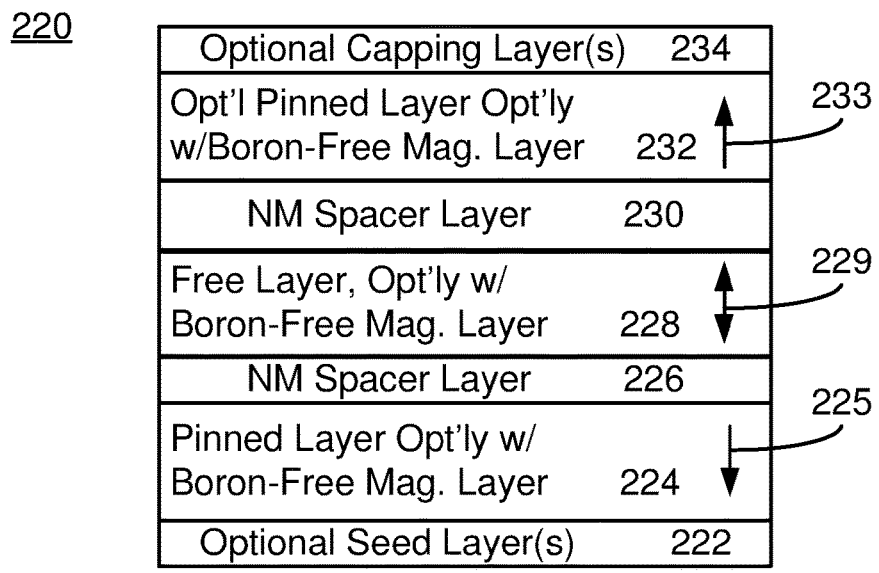
FIG. 8 depicts an exemplary embodiment of a magnetic junction having boron-free magnetic layer(s) and usable in magnetic devices such as a magnetic memory programmable using spin transfer torque.

FIG. 8 depicts an exemplary embodiment of a magnetic junction 220 that may be fabricated using the method 120. For clarity, FIG. 8 is not to scale. The magnetic junction 220 may be used in a magnetic device such as a STT-MRAM, SOT-MRAM, logic devices, other integrated circuits and, therefore, in a variety of electronic devices. The magnetic junction 220 includes optional seed layer(s) 222, a pinned layer 224 having a magnetic moment 225, a nonmagnetic spacer layer 226, a free layer 228 having magnetic moment 229, an optional additional nonmagnetic spacer layer 230, and an optional additional pinned layer 232 having magnetic moment 233. Also shown are capping layer(s) 234. A bottom contact and a top contact are not shown but may be formed. Similarly, polarization enhancement and other layers may be present but are not shown for simplicity. As can be seen in FIG. 8, the magnetic junction 220 is a dual magnetic junction. In another embodiment, the additional nonmagnetic spacer layer 230 and additional pinned layer 232 might be omitted. In such an embodiment, the magnetic junction 220 is a bottom pinned magnetic junction. Alternatively, the pinned layer 224 and nonmagnetic spacer layer 226 might be omitted. In such an embodiment, the magnetic junction 220 is a top pinned magnetic junction. Optional pinning layer(s) (not shown) may be used to fix the magnetization of the pinned layer(s) 224 and/or 232. In some embodiments, the optional pinning layer may be an AFM layer or multilayer that pins the magnetization(s) through an exchange-bias interaction. However, in other embodiments, the optional pinning layer may be omitted or another structure may be used.

In the embodiment shown in FIG. 8, one or more of the magnetic layers 224, 228 and 232 are formed using the method 100. Thus, the pinned layers 224 and 232 and the free layer 228 may have their magnetic moments 225, 229 and 233 stable perpendicular-to-plane, as shown. The magnetic junction 220 may also be configured to allow the free layer 228 to be switched between stable magnetic states when a write current is passed through the magnetic junction 220. Thus, the free layer 228 may be switchable utilizing STT when a write current is driven through the magnetic junction 220 in a current perpendicular-to-plane (CPP) direction. Alternatively, the magnetic junction may be configured such that other switching mechanisms may be used. The data stored in the magnetic junction 220, and thus the direction of magnetization of the free layer 228, may be read by driving a read current through the magnetic junction 220. The read current may also be driven through the magnetic junction 220 in the CPP direction. Thus, the magnetoresistance of the magnetic junction 220 provides the read signal.

The magnetic junction 220 may have improved performance due to fabrication using the method 100. More specifically, the magnetic junction 220 may enjoy the benefits described above for the method 100. A boron-free magnetic layer having a high PMA may be used in one or more of the layers 224, 228 and 232. When used in the free layer 228, the boron-free magnetic layer may provide improved stability. The magnetoresistance of such a magnetic junction 220 may also be improved. Further, if the free layer 228 consists of the boron-free magnetic layer 206, the free layer is compositionally uniform. As such, switching performance of the magnetic junction 220 may be improved. If used in the pinned layer(s) 224 and/or 232, the boron-free magnetic layer 206 may also improve the PMA of such a layer. Thus, performance a magnetic junction formed with the layer 206 fabricated using the method 100 may be improved.

Figure 9:
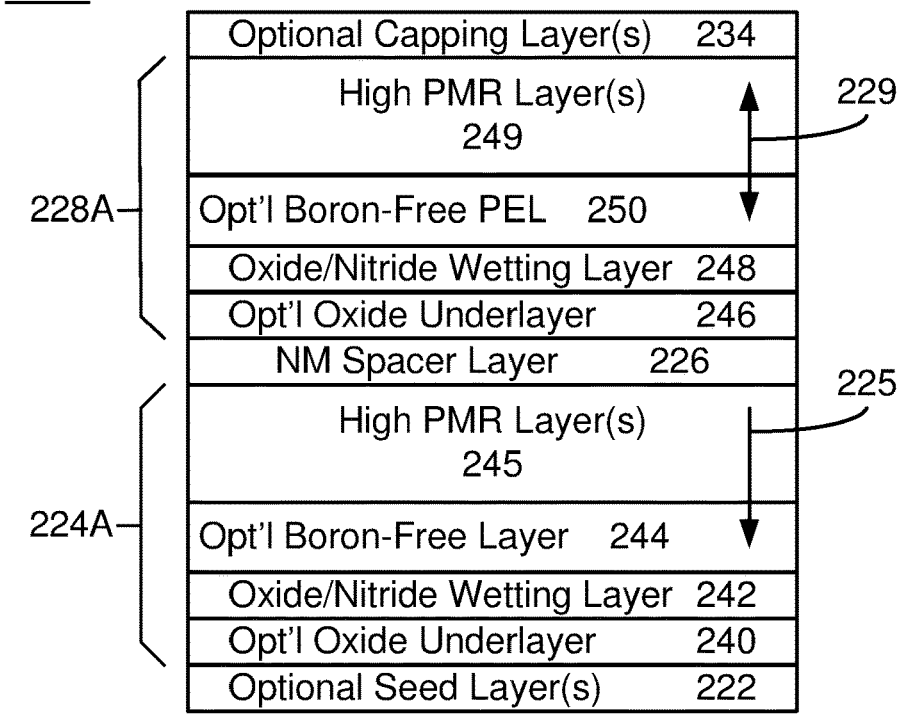
FIG. 9 depicts another exemplary embodiment of a magnetic junction having boron-free magnetic layer(s) and usable in magnetic devices such as a magnetic memory programmable using spin transfer torque.

FIG. 9 depicts an exemplary embodiment of a magnetic junction 220A that may be fabricated using the method 120. For clarity, FIG. 9 is not to scale. The magnetic junction 220A may be used in a magnetic device such as a STT-MRAM, SOT-MRAM, logic devices, other integrated circuits and, therefore, in a variety of electronic devices. The magnetic junction 220A is analogous to the magnetic junction 220. The magnetic junction 220A includes optional seed layer(s) 222, a pinned layer 224A having a magnetic moment 225, a nonmagnetic spacer layer 226, a free layer 228A and optional capping layer(s) 234 that are analogous to the layers 222, 223, 226, 228 and 234, respectively, shown in FIG. 8. The magnetic junction 220A is a bottom pinned magnetic junction.

The magnetic junction 220A explicitly includes oxide underlayer 240, oxide/nitride wetting layer 242 and boron-free magnetic layer 244 corresponding to the layers 202, 204 and 206 as part of the pinned layer 224A. The pinned layer 224A is shown as also including high PMR layers 245. Alternatively, the pinned layer 224A may consist of the layers 240, 242 and 244. In some embodiments, the seed layers 222 may function as the oxide underlayer 240. Similarly, the free layer 228A includes oxide underlayer 246, oxide/nitride wetting layer 248 and boron-free magnetic layer 250 corresponding to the layers 202, 204 and 206. The free layer 228A may also include high PMR layers 249. Alternatively, the free layer 228A may consist of the layers 246, 248 and 250. In some embodiments, the layers 240, 242 and 244 and/or the layers 246, 248 and 250 may be omitted and/or in another location.

The magnetic junction 220A may have improved performance due to fabrication using the method 100. More specifically, the magnetic junction 220A may have enhanced PMA, increased stability and improved switching characteristics.

Figure 10:
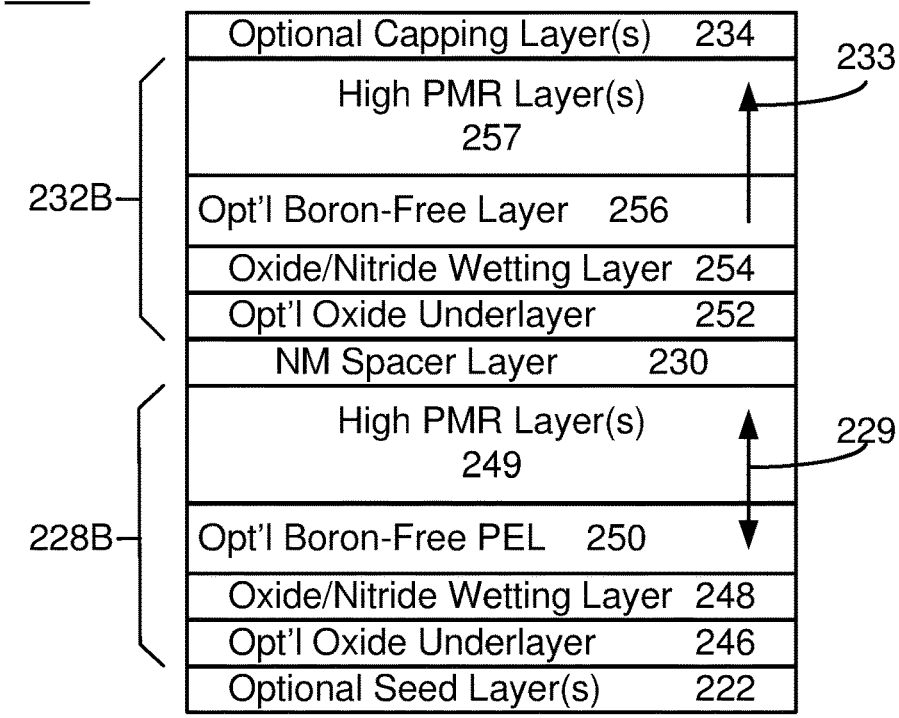
FIG. 10 depicts another exemplary embodiment of a magnetic junction having boron-free magnetic layer(s) and usable in magnetic devices such as a magnetic memory programmable using spin transfer torque.

FIG. 10 depicts an exemplary embodiment of a magnetic junction 220B that may be fabricated using the method 120. For clarity, FIG. 10 is not to scale. The magnetic junction 220B may be used in a magnetic device such as a STT-MRAM, SOT-MRAM, logic devices, other integrated circuits and, therefore, in a variety of electronic devices. The magnetic junction 220B is analogous to the magnetic junction 220. The magnetic junction 220B includes optional seed layer(s) 222, a free layer 228B having moment 229, a nonmagnetic spacer layer 230, a pinned layer 232B having a magnetic moment 225 and optional capping layer(s) 234 that are analogous to the layers 222, 228, 230, 232 and 234, respectively, shown in FIG. 8. The magnetic junction 220B is a top pinned magnetic junction.

The magnetic junction 220B explicitly includes oxide underlayer 246, oxide/nitride wetting layer 248 and boron-free magnetic layer 250 corresponding to the layers 202, 204 and 206 as part of the free layer 228B. The free layer 228B is shown as also including high PMR layers 245. Alternatively, the free layer 228B may consist of the layers 246, 248 and 250. In some embodiments, the seed layers 222 may function as the oxide underlayer 246. Similarly, the pinned layer 232B includes oxide underlayer 252, oxide/nitride wetting layer 254 and boron-free magnetic layer 256 corresponding to the layers 202, 204 and 206. The pinned layer 232B may also include high PMR layers 257. Alternatively, the pinned layer 232B may consist of the layers 252, 254 and 256. The layer 256 might be considered a PEL in some embodiments. In some embodiments, the layers 246, 248 and 250 or the layers 252, 254 and 256 may be omitted and/or in another location.

The magnetic junction 220B may have improved performance due to fabrication using the method 100. More specifically, the magnetic junction 220B may have enhanced PMA, increased stability and improved switching characteristics.

Figure 11:
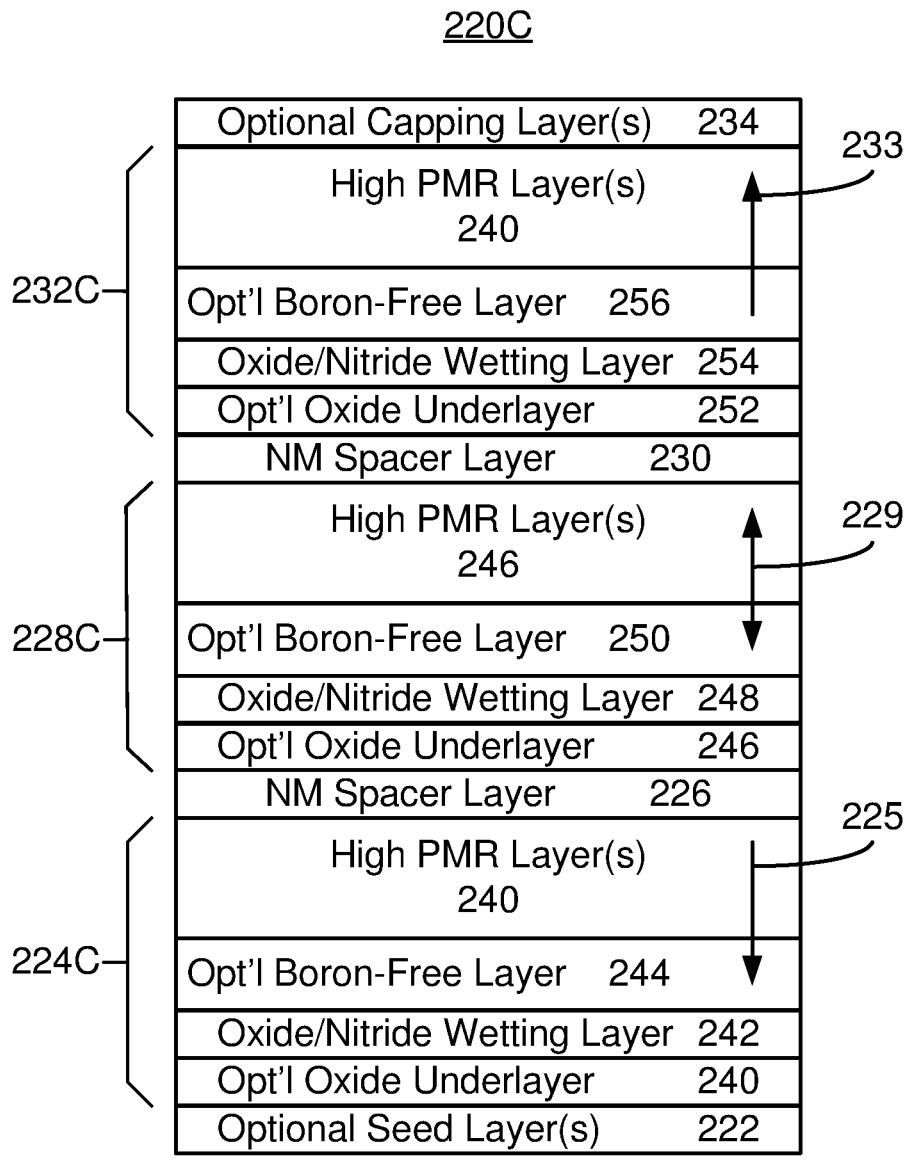
FIG. 11 depicts another exemplary embodiment of a magnetic junction having boron-free magnetic layer(s) and usable in magnetic devices such as a magnetic memory programmable using spin transfer torque.

FIG. 11 depicts an exemplary embodiment of a magnetic junction 220C that may be fabricated using the method 120. For clarity, FIG. 11 is not to scale. The magnetic junction 220C may be used in a magnetic device such as a STT-MRAM, SOT-MRAM, logic devices, other integrated circuits and, therefore, in a variety of electronic devices. The magnetic junction 220C is analogous to the magnetic junction 220. The magnetic junction 220C includes optional seed layer(s) 222, a pinned layer 224C having magnetic moment 225, nonmagnetic a spacer layer 226, a free layer 228C having moment 229, a nonmagnetic spacer layer 230, a pinned layer 232C having a magnetic moment 225 and optional capping layer(s) 234 that are analogous to the layers 222, 224, 226, 228, 230, 232 and 234, respectively, shown in FIG. 8. The magnetic junction 220C is a dual magnetic junction. Thus, one of the nonmagnetic spacer layers 226 and 230 may be the main barrier layer, while the other of the layers 226 and 230 may be a sub barrier layer.

The magnetic junction 220C explicitly includes oxide underlayer 240, oxide/nitride wetting layer 242 and boron-free magnetic layer 244 corresponding to the layers 202, 204 and 206 as part of the pinned layer 224C. The pinned layer 224C is shown as also including high PMR layers 245. Alternatively, the pinned layer 224C may consist of the layers 240, 242 and 244. In some embodiments, the seed layers 222 may function as the oxide underlayer 240. Similarly, the free layer 228C includes oxide underlayer 246, oxide/nitride wetting layer 248 and boron-free magnetic layer 250 corresponding to the layers 202, 204 and 206. The free layer 228C is shown as also including high PMR layers 245. Alternatively, the free layer 228C may consist of the layers 246, 248 and 250. The pinned layer 232C includes oxide underlayer 252, oxide/nitride wetting layer 254 and boron-free magnetic layer 256 corresponding to the layers 202, 204 and 206. The pinned layer 232C is shown as also including high PMR layers 245. Alternatively, the pinned layer 232C may consist of the layers 252, 254 and 256. In some embodiments, the layers 240, 242 and 244; the layers 246, 248 and 250 and/or the layers 252, 254 and 256 may be omitted and/or in another location.

The magnetic junction 220B may have improved performance due to fabrication using the method 100. More specifically, the magnetic junction 220C may have enhanced PMA, increased stability and improved switching characteristics.

Although the method and apparatus have been described in the context of specific features, steps and components, one of ordinary skill in the art will recognize that one or more of these features, steps and/or components may be combined in other manners not inconsistent with the description herein.

Figure 12:
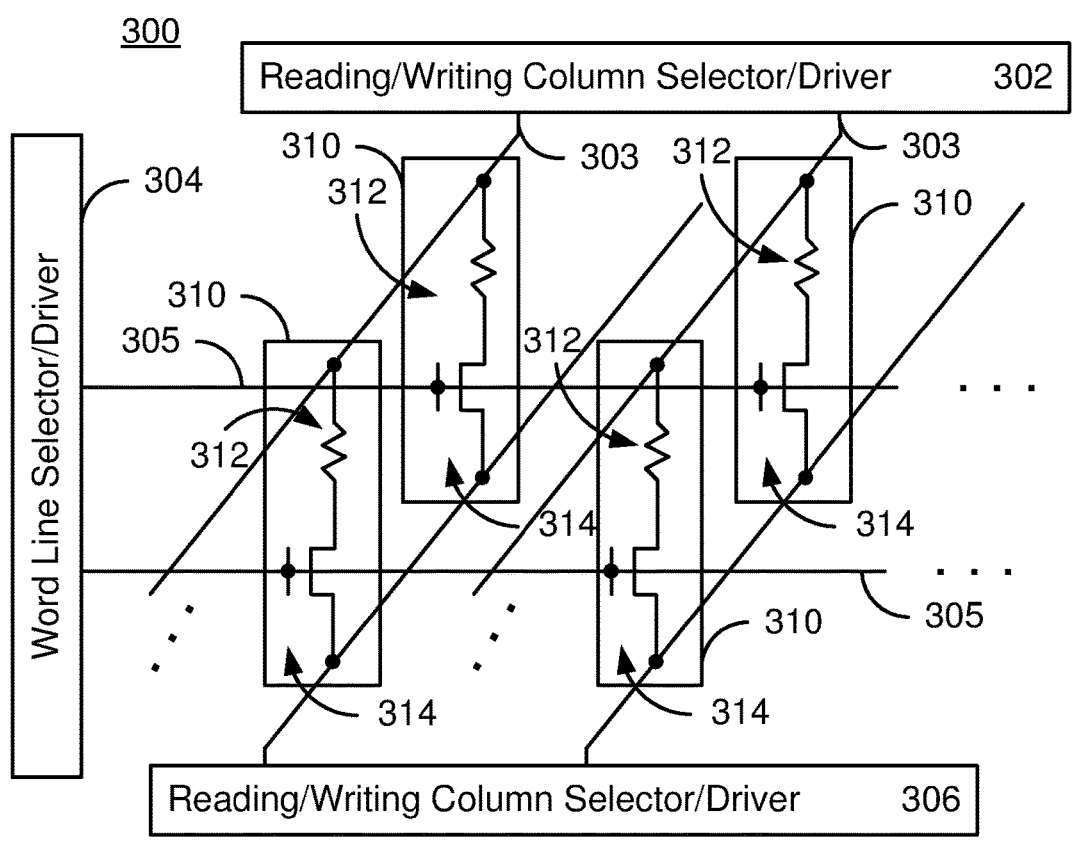
FIG. 12 depicts an exemplary embodiment of a memory utilizing magnetic junctions that have boron-free magnetic layer(s) in the memory element(s) of the storage cell(s).

FIG. 12 depicts an exemplary embodiment of a memory 300 that may use one or more of the magnetic junctions 220, 220A, 220B, 220C and/or other magnetic junctions including boron-free magnetic layer 206. The magnetic memory 300 includes reading/writing column select drivers 302 and 306 as well as word line select driver 304. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may be one of the magnetic junctions 220, 220A, 220B, 220C and/or other magnetic junctions including boron-free magnetic layer 206. Although one magnetic junction 312 is shown per cell 310, in other embodiments, another number of magnetic junctions 312 may be provided per cell. As such, the magnetic memory 300 may enjoy the benefits described above.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A method for providing magnetic junction residing on a substrate and usable in a magnetic device, the method comprising:
   providing a pinned layer, the pinned layer being magnetic;
   providing a nonmagnetic spacer layer; and
   providing a free layer, the nonmagnetic spacer layer being between the pinned layer and the free layer, the free layer being magnetic and switchable between a plurality of stable magnetic states, wherein at least one of the step of providing the pinned layer and the step of providing the free layer further include
      cooling a portion of the magnetic junction to within a temperature range including at least one temperature not greater than 250 K;
      depositing a wetting layer while the portion of the magnetic junction is cooled, the wetting layer having a thickness of not more than three monolayers and at least 0.25 monolayer, the wetting layer including at least one magnetic material;
      at least one of oxidizing and nitriding the wetting layer to provide a treated wetting layer, the treated wetting layer being an oxide wetting layer for an oxidizing process and a nitride wetting layer for a nitriding process; and
      depositing a boron-free magnetic layer on the treated wetting layer while at least the oxide wetting layer for the oxidizing process and the nitride wetting layer for the nitriding process is within the temperature range, the boron-free magnetic layer having a perpendicular magnetic anisotropy energy greater than an out-of-plane demagnetization energy.

2. The method of claim 1 wherein the temperature range is at least 50K and not greater than 150K.

3. The method of claim 2 wherein the temperature range is at least 70K and not greater than 100K.

4. The method of claim 2 wherein the wetting layer has a thickness of at least 0.75 monolayer and not more than 1.25 monolayers.

5. The method of claim 1 wherein the wetting layer has a thickness of at least 0.5 monolayer and not more than two monolayers.

6. The method of claim 1 wherein the step of providing the at least one of the free layer and the pinned layer further includes:
   annealing the boron-free magnetic layer at a temperature above 300 K.

7. The method of claim 1 wherein the oxidizing step further includes:
   naturally oxidizing the wetting layer.

8. The method of claim 1 wherein the wetting layer includes at least one of elemental Fe, elemental Co, elemental Ni, elemental Mn, an Fe-containing alloy, a Co-containing alloy, a Ni-containing alloy and a Mn containing alloy.

9. The method of claim 1 wherein the boron-free magnetic layer includes at least one of elemental Fe, elemental Co, elemental Ni, elemental Mn, an Fe-containing alloy, a Co-containing alloy, a Ni-containing alloy, a Mn containing alloy and a Heusler alloy.

10. The method of claim 1 wherein the step of providing the wetting layer further includes:
    providing the wetting layer on an oxide layer.

11. The method of claim 10 wherein the nonmagnetic spacer layer includes the oxide layer.

12. The method of claim 1 wherein the step of providing the at least one of the free layer and the pinned layer further includes:
    providing an oxide capping layer on the boron-free magnetic layer.

13. The method of claim 1 further comprising:
    providing an additional nonmagnetic spacer layer; and
    providing an additional pinned layer, the additional nonmagnetic spacer layer being between the additional pinned layer and the free layer.

14. The method of claim 1 wherein the at least one of the free layer and the pinned layer includes a polarization enhancement layer, and wherein the polarization enhancement layer includes the boron-free magnetic layer.

15. The method of claim 1 wherein the free layer is a multilayer.

16. The method of claim 1 wherein pinned layer is a multilayer.

17. The method of claim 1 wherein the free layer is switchable between the plurality of stable magnetic states using at least one of spin transfer torque and spin-orbit coupling torque.

18. A method for providing magnetic junction residing on a substrate and usable in a magnetic device, the method comprising:
    providing a pinned layer, the pinned layer being magnetic;
    providing a nonmagnetic spacer layer; and
    providing a free layer, the nonmagnetic spacer layer being between the pinned layer and the free layer, the free layer being magnetic and switchable between a plurality of stable magnetic states using at least one of spin transfer torque and spin-orbit coupling torque, wherein at least one of the step of providing the pinned layer and the step of providing the free layer further include
       depositing a wetting layer while the portion of the magnetic junction is cooled, the wetting layer having a thickness of not more than three monolayers and at least 0.25 monolayer, the wetting layer including at least one magnetic material;
       at least one of oxidizing and nitriding the wetting layer to provide a treated wetting layer, the treated wetting layer being an oxide wetting layer for an oxidizing process and a nitride wetting layer for a nitriding process;
       cooling a portion of the magnetic junction including the treated wetting layer to within a temperature range including at least one temperature not greater than 250 K; and
       depositing a boron-free magnetic layer on the treated wetting layer while the portion of the magnetic junction is within the temperature range, the boron-free magnetic layer having a perpendicular magnetic anisotropy energy greater than an out-of-plane demagnetization energy.

19. A memory magnetic junction residing on a substrate and comprising:

a plurality of magnetic storage cells, each of the plurality of magnetic storage cells including at least one magnetic junction, the at least one magnetic junction including a free layer, a nonmagnetic spacer layer and a pinned layer, the nonmagnetic spacer layer residing between the pinned layer and the free layer, the free layer being switchable between a plurality of stable magnetic states when a write current is passed through the magnetic junction, at least one of the free layer and the pinned layer including a boron-free magnetic layer, the boron-free magnetic layer having a perpendicular magnetic anisotropy energy greater than an out-of-plane demagnetization energy.

* * * * *